United States Patent
Yamamoto et al.

(10) Patent No.: US 7,145,170 B2
(45) Date of Patent: Dec. 5, 2006

(54) COUPLED SUPERCONDUCTING CHARGE QUANTUM BIT DEVICE AND CONTROLLED-NOT GATE USING THE SAME

(75) Inventors: Tsuyoshi Yamamoto, Tokyo (JP); Yasunobu Nakamura, Tokyo (JP); Jaw-Shen Tsai, Tokyo (JP)

(73) Assignees: NEC Corporation, Toyko (JP); Riken, Saitama (JP)

( * ) Notice: Subject to any disclaimer, the term of this patent is extended or adjusted under 35 U.S.C. 154(b) by 59 days.

(21) Appl. No.: 10/910,770

(22) Filed: Aug. 4, 2004

(65) Prior Publication Data
US 2005/0062072 A1    Mar. 24, 2005

(30) Foreign Application Priority Data
Aug. 5, 2003 (JP) ............................ 2003-286640

(51) Int. Cl.
H01L 29/06 (2006.01)
H01L 29/08 (2006.01)
H01L 39/00 (2006.01)
(52) U.S. Cl. .................. 257/30; 257/39; 257/183; 257/E39.013; 257/E39.016; 257/E39.019; 257/E39.02
(58) Field of Classification Search .................. 257/30, 257/39, 183
See application file for complete search history.

(56) References Cited

U.S. PATENT DOCUMENTS
2005/0082519 A1 * 4/2005 Amin et al. ................... 257/13

FOREIGN PATENT DOCUMENTS
JP    2000-277723    10/2000

OTHER PUBLICATIONS

Y. Nakamura, et al., "Coherent Control of Macroscopic Quantum States in a Single-Cooper-Pair Box", Nature, vol. 398, Apr. 29, 1999, pp. 786-788.
Alexander Shnirman, et al., "Quantum Manipulation of Small Josephson Junctions", Physical Review Letters, vol. 79, No. 12, Sep. 22, 1997, pp. 2371-2374.
Yu. A. Pashkin, et al., "Quantum Oscillations in Two Coupled Charge Qubits", Nature, vol. 421, Feb. 20, 2003, pp. 823-826.

* cited by examiner

*Primary Examiner*—Ngân V. Ngô
(74) *Attorney, Agent, or Firm*—McGinn IP Law Group, PLLC

(57) ABSTRACT

A control quantum bit circuit and a target quantum bit circuit each have a quantum box electrode including a superconductor, a counter electrode coupled to the quantum box electrode through a tunnel barrier, and a gate electrode coupled to the quantum box electrode through a gate capacitor. The quantum box electrode of the control quantum bit circuit is coupled to the quantum box electrode of the target quantum bit circuit through a box-electrode coupling capacitor.

20 Claims, 5 Drawing Sheets

COUPLED SUPERCONDUCTING CHARGE QUANTUM BIT DEVICE AND CONTROLLED-NOT GATE USING THE SAME This application claims priority to prior Japanese patent application JP 2003-286640, the disclosure of which is incorporated herein by reference.

BACKGROUND OF THE INVENTION

The present invention relates to a method for implementing a logic operation in quantum computing devices constructed by Josephson coupled systems.

Quantum computers are new computers actively using the basic principle of quantum mechanics. The quantum computer can solve a specific problem, for example, the prime factorization of large natural numbers, much faster than conventional classical computers can do. The quantum computer uses a quantum two-level system, called a quantum bit, corresponding to a bit used in the classical computer.

In other words, the basic unit of the information in the quantum computer is defined by a quantum bit (qubit). A qubit corresponds to, for example, an atom (ion) having different quantum states. Two of the quantum states are used to store digital information.

There are candidates for quantum two-level systems. From the viewpoint of quantum bit integration, solid-state devices are promising. A quantum bit using a superconducting device has good coherence. Accordingly, the quantum bit using the superconducting device holds a big lead in the solid-state devices.

Japanese Unexamined Patent Application Publication No. 2000-277723 (herein below, referred to as Patent Document 1) discloses a quantum computing device whereby it is unnecessary to extract high-speed signals, thus easily reading out the result of a computation. In the quantum computing device, a quantum bit is formed by a quantum box electrode and a counter electrode, or formed by a superconducting box electrode and a superconducting counter electrode. The quantum bit is controlled by a gate voltage that is applied to a gate electrode. A probe electrode is coupled to the quantum bit via a tunnel barrier. The probe electrode can read out the state of the quantum bit after computation and also can prepare the initial state thereof before computation. An electrostatic potential of the superconducting box electrode is controlled by the gate voltage applied to the gate electrode. Thus, a transition In Cooper-pair tunneling through the tunnel barrier, namely, the state of the quantum bit is controlled. The probe electrode is biased to a positive voltage. So long as at least one excess Cooper pair exists in the superconducting box electrode, the probe electrode extracts two electrons with two quasiparticle tunneling events through the tunnel barrier to observe the state of the quantum bit.

The Cooper pair will now be described. In normal metals, a weak Coulomb repulsion acts between electrons. Electrons move independently of each other. On the other hand, when an attractive interaction acts between electrons even slightly, an energy produced by a pair of electrons, of which momentums are equal in size and opposite in direction, is lower than that produced by electrons moving independently of each other. The pair of electrons is called a Cooper pair. In metals in each of which the attractive interaction acts between electrons, when energy saved by generating Cooper pairs is higher than that of thermal agitation, many electrons are paired, thus condensing into one energy state. This state corresponds to superconductivity. The phenomenon of perfect diamagnetism (Meissner effect) is explained based on the fact that the condensed Cooper pairs have the same phase and all of the Cooper pairs can be described by one wave function.

A quasiparticle will now be described. In a superconducting metal, many electrons are paired as Cooper pairs and are condensed into one energy state. When energy (superconducting gap energy) of a predetermined level or more caused by lattice vibration or external light irradiation is applied to the Cooper pairs, each Cooper pair is broken into two electrons. The electrons are in a superconductor excited state. The state of each of the two electrons is different from that of a free electron in a normal metal. Therefore, the electron In this state is called a quasiparticle in order to distinguish from the normal free electron. In a tunnel function including two superconducting electrodes, a quasiparticle current steeply increases by a voltage corresponding to the sum of gap energies of both the superconducting electrodes. Thus, the current-voltage characteristic exhibits strong non-linearity.

One-bit operation of the quantum bit using superconducting devices has been reported In "Nature (ENGLAND)", Vol. 398, pp. 786–788, Apr. 29, 1999. It is known that when one bit gate for controlling one bit is combined with a two-bit gate, called a controlled-NOT gate, all of operations necessary for quantum computing is made possible.

Therefore, realizing a controlled-NOT gate in quantum bit using superconducting devices is of extreme importance.

As shown in FIG. 1, a controlled-NOT gate has an input composed of a control bit and a target bit, namely, two quantum bits. Only when the state of the control bit is "0", the value of the target bit is inversed. Although this definition is different from the general one, where the value of the target bit is inversed only when the state of the control bit is "1", this difference gives no essential restriction.

A theoretical approach to realize a controlled-NOT gate using superconducting charge quantum bits has been reported in "Physical Review Letters", Vol. 79, pp. 2371–2374, Sep. 22, 1997. However, the controlled-NOT gate requires a large inductance to couple two quantum bits. Disadvantageously, it is difficult to realize this controlled-NOT gate, One approach to coupling quantum bits uses capacitance. The fabrication of devices for this approach is easier than that using inductance. Furthermore, the devices for this approach can be made compact. Actually, superconducting charge quantum bits coupled by using the capacitance have already been produced. The quantum oscillation of the quantum bits has been observed ("Nature (ENGLAND)", Vol. 421, pp. 823–826, Feb. 20, 2003).

However, any method for producing a controlled-NOT gate in superconducting charge quantum bits coupled by using the capacitance has not been proposed.

SUMMARY OF THE INVENTION

In consideration of the above-mentioned circumstances, it is an object of the present invention to provide a controlled-NOT gate in superconducting charge quantum bits coupled by using capacitance.

According to a first aspect of the present invention, there is provided a superconducting charge quantum multi-bit device. The superconducting charge quantum multi-bit device includes a first superconducting charge quantum bit device, a second superconducting charge quantum bit device, and an electric capacitor coupling the first and second superconducting charge quantum bit devices.

Preferably, in the present superconducting charge quantum multi-bit device, each of the first and second superconducting charge quantum bit devices has a quantum box electrode including a superconductor, a counter electrode coupled to the quantum box electrode through a tunnel barrier, and a gate electrode coupled to the quantum box electrode through a gate electrostatic capacitor. Preferably, the quantum box electrode of the first superconducting charge quantum bit device is coupled to the quantum box electrode of the second superconducting charge quantum bit device through the electric capacitor.

According to a second aspect of the present invention, there is provided a controlled-NOT gate using coupled superconducting charge quantum bits including first and second superconducting bit devices. In the present controlled-NOT gate, each of the first and second superconducting bit devices has a quantum box electrode including a superconductor, a counter electrode coupled to the quantum box electrode through a tunnel barrier, and a gate electrode coupled to the quantum box electrode through a first electrostatic capacitor. The quantum box electrode of the first superconducting bit device is coupled to the quantum box electrode of the second superconducting bit device through a second electrostatic capacitor. In the present controlled-NOT gate, the gate electrode of the second superconducting bit device further includes a pulse supply unit for supplying a predetermined pulse.

Preferably, in the present controlled-NOT gate, the predetermined pulse includes a voltage, of which peak value is determined by the first electrostatic capacitor of the second superconducting bit device, and the duration of the peak value is determined by a Josephson coupling energy produced between the corresponding superconducting box electrode and counter electrode. The predetermined pulse may include a trapezoidal pulse. The pulse supply unit may supply a microwave pulse as the predetermined pulse to the gate electrode of the second superconducting bit device.

According to a third aspect of the present invention, there is provided a method for generating entanglement of coupled superconducting charge quantum bits in which first and second superconducting bit devices are coupled. Each of the first and second superconducting bit devices has a quantum box electrode including a superconductor, a counter electrode coupled to the quantum box electrode through a tunnel barrier, and a gate electrode coupled to the quantum box electrode through a first electrostatic capacitor. The quantum box electrode of the first superconducting bit device is coupled to the quantum box electrode of the second superconducting bit device through a second electrostatic capacitor.

In the present entanglement generating method, a voltage determined by the first electrostatic capacitor is applied to the corresponding gate electrode of each of the first and second superconducting bit devices for a predetermined time.

Preferably, in the present entanglement generating method, the voltage determined by the first electrostatic capacitor is obtained by dividing an elementary charge by the capacitance of the first electrostatic capacitor.

DESCRIPTION OF THE PREFERRED EMBODIMENTS

An embodiment of the present invention will now be described in detail with reference to the drawings.

Figure 2:
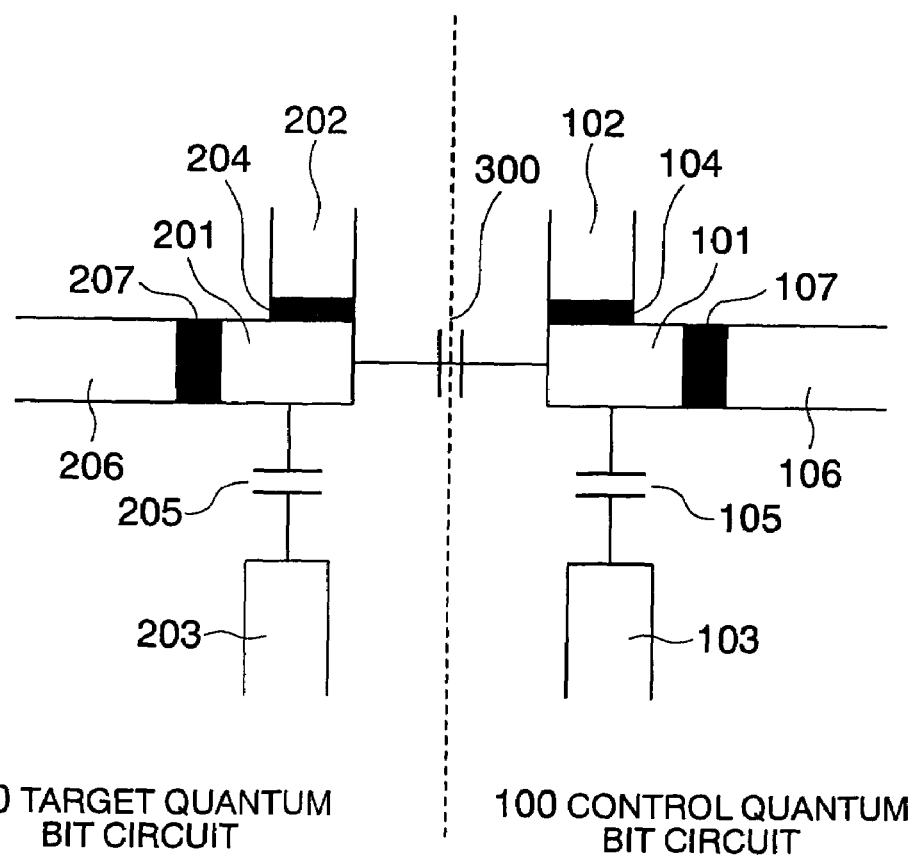
FIG. 2 is a typical circuit diagram of two superconducting charge quantum bits coupled through a capacitor.

FIG. 2 is a circuit diagram showing a typical example of coupled superconducting charge quantum bit circuits. Two superconducting charge quantum bit circuits are arranged on the right and left of the dashed line in FIG. 2, respectively. Each circuit is the same as that disclosed in Patent Document 1. According to the present embodiment, a quantum bit "0" denotes a state in which there is no excess Cooper pair in a box electrode and a quantum bit "1" denotes another state in which there is excess Cooper pair. This state is controlled using a gate voltage. A read-out electrode is provided for each of two quantum box electrodes. If different read-out technique is used, the read-out electrodes are not necessarily needed.

The superconducting charge quantum bit circuit may also be called a superconducting charge quantum bit device or a superconducting bit device. Referring to FIG. 2, the right superconducting charge quantum bit circuit is called a control quantum bit circuit 100 and the left one is called a target quantum bit circuit 200.

The control quantum bit circuit 100 includes a first superconducting box electrode 101, a first counter electrode 102, a first gate electrode 103, a first tunnel barrier 104, a first gate capacitor 105, a first read-out electrode 106, and a second tunnel barrier 107.

The first superconducting box electrode 101 includes a superconductor that becomes superconductive at a low temperature. The first counter electrode 102 includes a superconductor which also functions as a source. The first tunnel barrier 104 includes a thin layer between the first superconducting box electrode 101 and the first counter electrode 102. The first gate capacitor 105 is arranged between the first gate electrode 103 and the first superconducting box electrode 101. The first read-out electrode 106 includes a superconductor which also serves as a drain. The second tunnel barrier 107 between the first superconducting box electrode 101 and the first read-out electrode 106 is thicker than the first tunnel barrier 104.

Similarly, the target quantum bit circuit 200 includes a second superconducting box electrode 201, a second counter electrode 202, a second gate electrode 203, a third tunnel barrier 204, a second gate capacitor 205, a second read-out electrode 206, and a fourth tunnel barrier 207.

The second superconducting box electrode 201 includes a superconductor that becomes superconductive at a low temperature. The second counter electrode 202 includes a superconductor that also functions as a source. The third tunnel barrier 204 includes a thin layer between the second superconducting box electrode 201 and the second counter electrode 202. The second gate capacitor 205 is arranged between the second gate electrode 203 and the second superconducting box electrode 201. The second read-out electrode 206 includes a superconductor which also serves as a drain. The fourth tunnel barrier 207 between the second superconducting box electrode 201 and the second read-out electrode 206 is thicker than the third tunnel barrier 204.

As shown in FIG. 2, the first superconducting box electrode 101 is coupled to the second superconducting box electrode 201 through a box-electrode coupling capacitor 300. Thus, the two quantum bits have the interaction with each other.

In the following description, the right circuit serves as a control bit and the left circuit serves as a target bit.

Assuming that this quantum bits constitute one two quantum bit system, the present two quantum bit system has four states, namely, "00", "01", "10", and "11". The state "01" indicates that the first superconducting box electrode 101 has no excess Cooper pair and the second superconducting box electrode 201 has one excess Cooper pair. The state "10" indicates that the first superconducting box electrode 101 has one excess Cooper pair and the second superconducting box electrode 201 has no excess Cooper pair. The state "00" denotes that the first and second superconducting box electrodes 101 and 102 each have no excess Cooper pair. The state "11" denotes that the first and second superconducting box electrodes 101 and 102 each have one excess Cooper pair.

When hamiltonian of the present system is expressed as a matrix using bases "00", "01", "10", and "11", the following expression 1 is obtained.

$$H = \begin{pmatrix} E_{00} & -\frac{1}{2}E_{J1} & -\frac{1}{2}E_{J2} & 0 \\ -\frac{1}{2}E_{J1} & E_{01} & 0 & -\frac{1}{2}E_{J2} \\ -\frac{1}{2}E_{J2} & 0 & E_{10} & -\frac{1}{2}E_{J1} \\ 0 & -\frac{1}{2}E_{J2} & -\frac{1}{2}E_{J1} & E_{11} \end{pmatrix} \quad (1)$$

$$E_{n1n2} = E_{c1}(n_{g1} - n_1)^2 + E_{c2}(n_{g2} - n_2)^2 + E_m(n_{g1} - n_1) \cdot (n_{g2} - n_2)$$

Where, $E_{J1}$ and $E_{J2}$ denote the Josephson coupling energies of the first and third tunnel barriers 104 and 204, respectively. $E_{C1}$ denotes the charging energy of one Cooper pair of the first superconducting box electrode 101 and $E_{C2}$ denotes the charging energy of one Cooper pair of the second superconducting box electrode 201. $E_m$ denotes the coupling capacitor energy between the first and second superconducting box electrodes 101 and 201. This energy is defined by the following expression 2.

$$E_m = 4e^2 C_m/(C\Sigma 1 C\Sigma 2 - C_m^2) \quad (2)$$

Where, $C\Sigma 1$ and $C\Sigma 2$ denote the entire capacitances of the first and second superconducting box electrodes 101 and 102, respectively, and $C_m$ denotes the capacitance of the box-electrode coupling capacitor 300.

To increase the efficiency of a controlled-NOT gate, which will be described later, it is desirable that the coupling capacitor energy be larger on condition that $E_{C1} \gg E_{J1}$ and $E_{C2} \gg E_{J2}$. n1 denotes the number of excess Cooper pairs in the first superconducting box electrode 101 and n2 denotes the number of excess Cooper pairs in the second superconducting box electrode 201.

$n_{g1}$ denotes the number of Cooper pairs induced in the first superconducting box electrode 101 by the first gate electrode 103. Assuming that $C_{g1}$ denotes the capacitance of the first gate capacitor 105 and $V_{g1}$ denotes a voltage applied to the first gate electrode 103, $n_{g1} = C_{g1} * V_{g1}/2/e$, where e denotes an elementary charge.

Similarly, $n_{g2}$ indicates the number of Cooper pairs induced in the second superconducting box electrode 201 by the second gate electrode 203. Assuming that $C_{g2}$ denotes the capacitance of the second gate capacitor 205 and $V_{g2}$ denotes a voltage applied to the second gate electrode 203, $n_{g2} = C_{g2} * V_{g2}/2/e$.

Figure 3A:
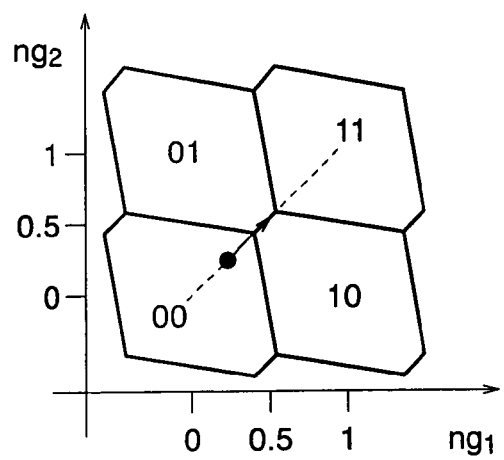
FIGS. 3A and 3B are diagrams explaining a method for generating entanglement according to the present invention.

FIG. 3A is a diagram showing the lowest charge energy state in an $n_{g1}$-$n_{g2}$ plane. Referring to FIG. 3A, among four charge states "00", "01", "10", and "11", the energy of the state "00" is the lowest in the lower left area of four areas. Similarly, in the lower right area, the charge state "10" has the lowest energy. On the border between the lower right and left areas, the energy of the charge state "00" equals that of the charge state "10".

In the following description, these areas will be called as 00, 01, 10, and 11.

A method for generating entanglement will now be described. "Entanglement" means a non-local correlation that appears in an "inseparable" state of the quantum system including a plurality of subsystems. The inseparable state cannot be expressed by products of the subsystem states. Entanglement, which annoyed Einstein, is a very important resource peculiar to quantum information processing. Entanglement can be a key to give an advantage to quantum information processing over classical information processing.

A DC voltage is applied to each of the second gate electrode 203 and the first gate electrode 103, so that an operating point is moved to an appropriate position (for example, a filled dot in FIG. 3A) in the area 00.

Subsequently, the application of a pulse voltage to each of the second gate electrode 203 and the first gate electrode 103 will now be described. In the following description, except where specifically noted, an ideal rectangular pulse with no rise time and no fall time as shown in FIG. 3B is considered.

Applying the pulse voltage to the first gate electrode 103 means that the state is shifted parallel to the axis of $n_{g1}$ in the $n_{g1}$-$n_{g2}$ plane of FIG. 3A. Applying the pulse voltage to the second gate electrode 203 means that the state is shifted parallel to the axis of $n_{g2}$ in the $n_{g1}$-$n_{g2}$ plane of FIG. 3A. Therefore, the pulse voltages applied to both the gate electrodes are controlled, so that the state can be shifted to an arbitrary point in the $n_{g1}$-$n_{g2}$ plane. For example, as shown by an arrow in FIG. 3A, the state designated by the filled dot can be shifted to a position at $(n_{g1}, n_{g2})=(0.5, 0.5)$. Assuming that the coordinates of an initial operating point of the filled dot are $(n_{g1}, n_{g2})$, specific pulse voltages $(V_{p1}, V_{p2})$ are obtained as $V_{p1}=2*e*(0.5-n_{g1i})/C_{g1}$ and $V_{p2}=2*e*(0.5-n_{g2i})/C_{g2}$.

Figure 3B:
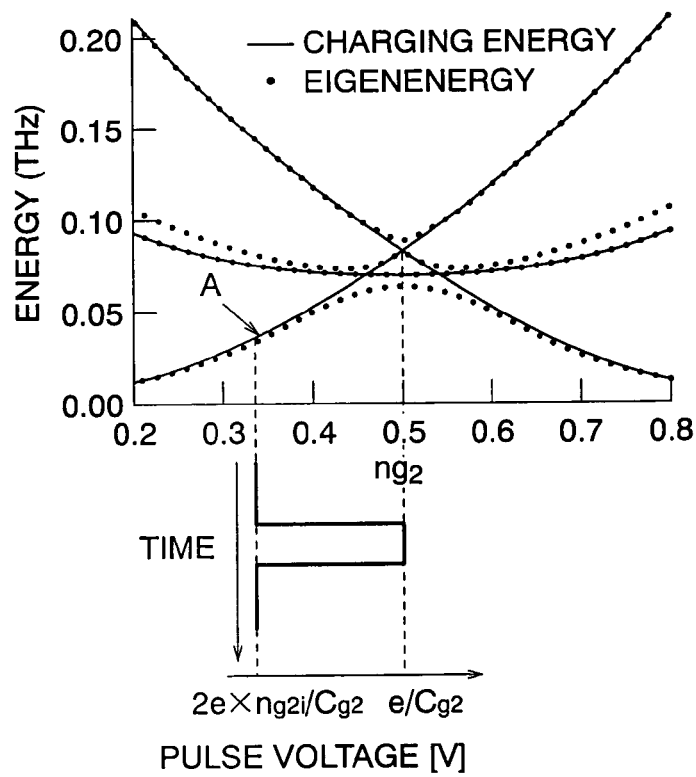

FIG. 3B is a diagram showing system energy bands in the variation of $n_{g1}$ and $n_{g2}$ along the dashed line in FIG. 3A. Typical parameters ($E_{c1}$=580 meV, $E_{c2}$=671 meV, $E_m$=96 meV) are used for a calculation. The application of the above-mentioned pulses means that an initial state corresponding to a point A in FIG. 3B is shifted to a position where four energy bands are the closest to each other, namely, a point at $n_{g1}=(n_{g2})=0.5$.

Consequently, the state starts to oscillate between the four charge states "00", "01", "10", and "11" The oscillation continues while the pulses are In the ON state. Thus, entanglement can be generated.

Figure 4A:
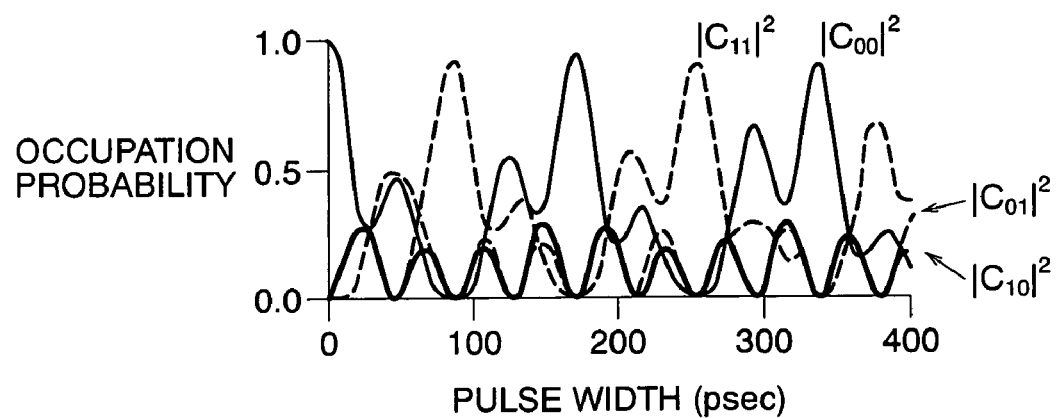
FIGS. 4A and 4B show the result of a numerical calculation according to an embodiment of the present invention.
Figure 4B:
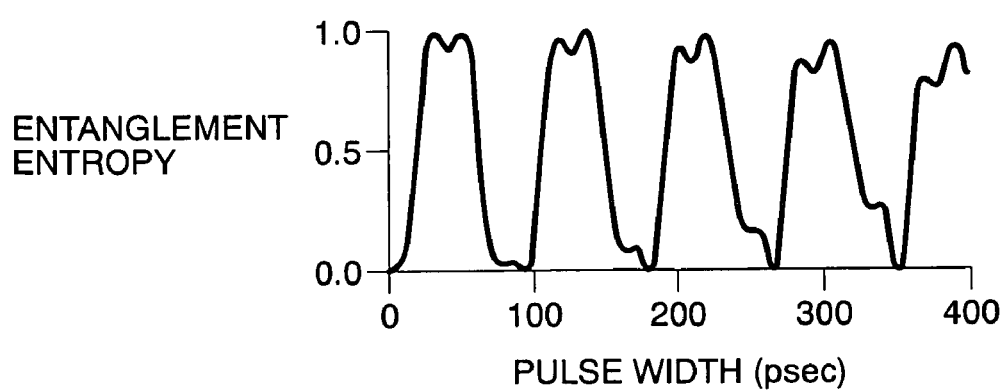

FIGS. 4A and 4B show the result of a calculation of the oscillation between the four charge states. Referring to FIG. 4A, the abscissa axis denotes the length of a pulse. The ordinate axis denotes the square of an absolute value of each of four coefficients $c_{00}$, $c_{01}$, $c_{10}$, and $c_{11}$ for the wavefunction expressed as $c_{00}|00>+c_{01}|01>+c_{10}|10>+c_{11}|11>$ using the four charge states "00","01", "10", and "11" as bases. It is found that the respective coefficients oscillate with the pulse length.

FIG. 4B is a plot diagram showing the strength of entanglement in time when time development occurs as shown in FIG. 4A. The ordinate axis denotes amount that is called entanglement entropy. The entanglement entropy takes on values from 0 to 1. As the value is larger, the entanglement is stronger. The strength of entanglement varies over time. For example, it is found that the maximum entanglement appears approximately at 150 ps.

Figure 5A:
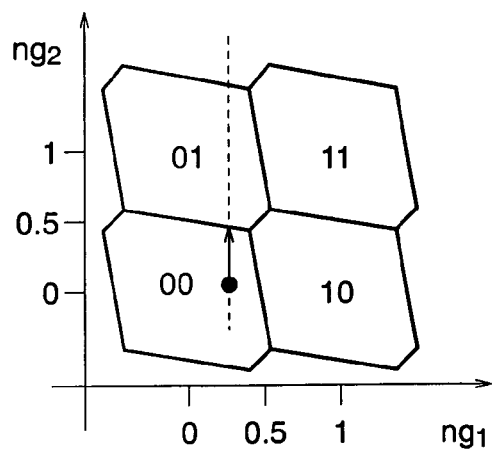
FIGS. 5A and 5B are diagrams explaining the operation of a quantum controlled-NOT gate according to the present invention.

A method for implementing a controlled-NOT gate will now be described. FIG. 5A is a diagram showing the same $n_{g1}$–$n_{g2}$ plane as that of FIG. 3A.

A DC voltage is applied to each of the gate electrodes 103 and 203, so that the operating point is moved in the vicinity of a point at $n_{g1}$=0.25 in the area 00 of FIG. 5A. If the operating point is slightly deviated from the point at $n_{g1}$=0.25, it is no problem. If $n_{g1}$ is approximate to 0.5, the control bit may also be oscillated upon applying a voltage pulse. It is undesirable.

Subsequently, the application of a pulse voltage to the second gate electrode 203 will now be described. At that time, as shown by the arrow in FIG. 5A, the height of the pulse voltage is adjusted so that the charge state is located on the border between the area 00 and the area 01 upon applying the pulse. Assuming that the coordinates of an initial operating point are $(n_{g1i}, n_{g2i})$, the magnitude $V_{p2}$ of the pulse voltage is obtained as $V_{p2}=e*(1-E_m*n_{g1i}-2*n_{g2i})/C_{g2}$, This means that the peak value of the pulse voltage is defined by the capacitance $C_{g2}$ of the second gate capacitor 205.

Figure 5B:
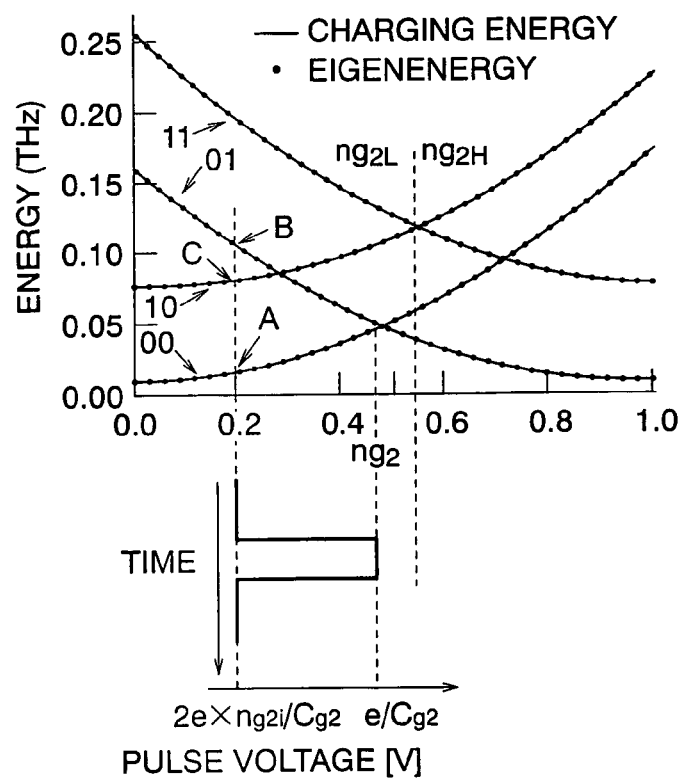

Energy bands of the present system in the dashed line ($n_{g1}$=0.25) in FIG. 5A will now be described (FIG. 5B). It is assumed that the operating point is located at $(n_{g1}, n_{g2})$= (0.25, 0.2). The above-mentioned pulse applying operation results in the nonadiabatic transition of the initial state to $n_{g2}$ ($n_{g2L}$) corresponding to a charging-energy degeneracy point of "00" and "01".

First, a case where the initial state is "00" will now be described. The state "00" is located at a point A in the diagram of FIG. 5B. Due to the abovementioned pulse application, the initial state starts quantum oscillation between "00" and "01". As is obviously understood from the energy band diagram, the states "10" and "11" are separated from the states "00" and "01" in terms of energy. Accordingly, the states "10" and "11" hardly contribute to the oscillation.

Figure 6A:
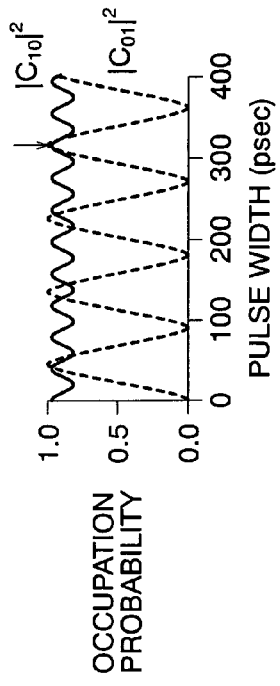
FIGS. 6A to 6F show the result of a numerical calculation according to the present embodiment of the present invention.

FIG. 6A shows the result of a calculation of the quantum oscillation. In the calculation, parameters for energies are set as typical typical values, namely, $E_{c1}$=580 meV, $E_{c2}$=671 meV, $E_m$=190 meV, and $E_{J2}$=45 meV.

Referring to FIG. 6A, the abscissa axis denotes the length of a pulse. The ordinate axis denotes the square of an absolute value of each of the four coefficients $c_{00}$, $c_{01}$, $c_{10}$, and $c_{11}$ for the wavefunction expressed as $c_{00}|00>+c_{01}|01>+c_{10}|10>+c_{11}|11>$ using the four charge states "00","01", "10", and "11" as bases. It is found that the initial state "00" oscillates between "00" and "01" in time. Oscillation period is given by $h/E_{J2}$ (h: Planck constant). This means that the duration (pulse width) is determined by the Josephson coupling energy $E_{J2}$ of the third tunnel barrier 204, namely, the Josephson coupling energy between the superconducting box electrode 201 and the counter electrode 202.

Subsequently, a case where the initial state is "10" will now be described. The state "10" is located at a point C in the energy band diagram of FIG. 5B. It is assumed that a pulse with the same height as the foregoing case is applied to this initial state.

Figure 6B:
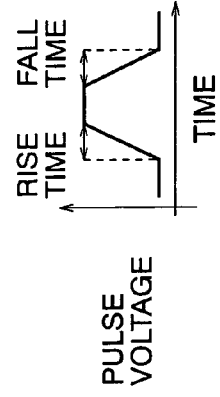

This pulse does not reach $n_{g2H}$ corresponding to the charge degeneracy point between "10" and "11". Thus, the oscillation is suppressed. FIG. 6B shows the result of a calculation. It is found that oscillation hardly occurs and the initial state "10" is held as it is.

Figure 1:
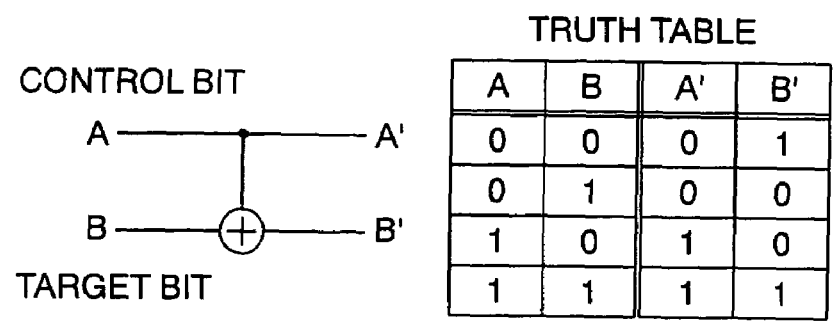
FIG. 1 shows a logical table of a controlled-NOT gate.

On the basis of the above-mentioned results, the implementation of the gate operation shown in the truth table of FIG. 1 will now be described. When "00" is input, it is desirable to output "01" with a probability of, ideally, 1. This condition is satisfied at time shown by each arrow in FIG. 6A. The result of a calculation (not shown) obtained when the initial state is "01" is the same as that of FIG. 6A except that $c_{00}$ and $c_{01}$ change places. Therefore, "00" is realized at the same time with a probability of 1. In other words, the upper two operations of the truth table in FIG. 1 are realized by the above-mentioned pulse lengths.

On the other hand, when "10" is input, oscillation hardly occurs as shown in FIG. 6B. Consequently, "10" is obtained as an output with a probability of about 1 independent of the pulse width. When "11" is input, the similar result is obtained. If an input state is in a general superposition state, an output state is in a superposition obtained by performing the gate operation to the each of the superposed states in the input. Therefore, the application of the pulse having the pulse width shown by the arrows in FIG. 6A and having a height of $V_{p2}=e*(1-E_m*n_{g1i}-2*n_{g2i})/C_{g2}$ realizes a controlled-NOT quantum gate operation.

Figure 6C:
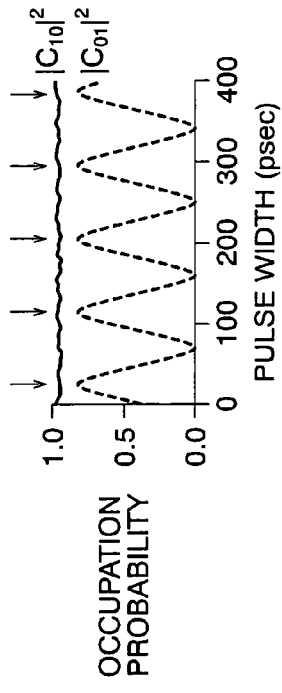
Figure 6D:
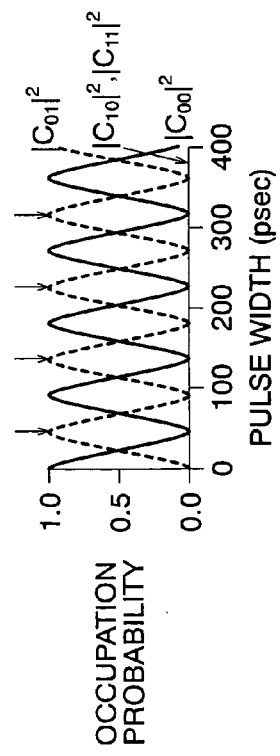

The amplitude of oscillation of FIG. 6B is given by $E_{J2}^2/(E_m^2+E_{J2}^2)$. If the value of $E_m$ cannot be enough large, the oscillation amplitude becomes large. Therefore, the above-mentioned method is not always used, FIG. 6C shows the result of a calculation when $E_m$ is set to 95 meV that is half that of FIG. 6B. It is found that a small oscillation occurs between $c_{10}$ and $c_{11}$. In this case, the difference between oscillation periods can be used. As mentioned above, the oscillation period of FIG. 6A is given by $h/E_{J2}$. On the other hand, the oscillation period of FIG. 6C is given by $h/(E_m^2+E_{J2}^2)^{0.5}$. So long as $E_m$ is not zero, these oscillation periods are different from each other. FIG. 5D is a diagram obtained by replotting data ($c_{01}$) shown by the dashed line in FIG. 6A and data ($c_{10}$) shown by the solid line in FIG. 6C. Referring to FIG. 6D, two oscillating curves peak approximately at the same time shown by the arrow. When a pulse having such a pulse width is applied to the quantum system, the desired gate operation can be obtained.

Figure 6E:
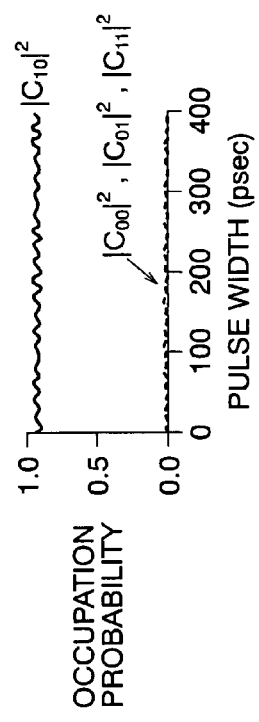
Figure 6F:
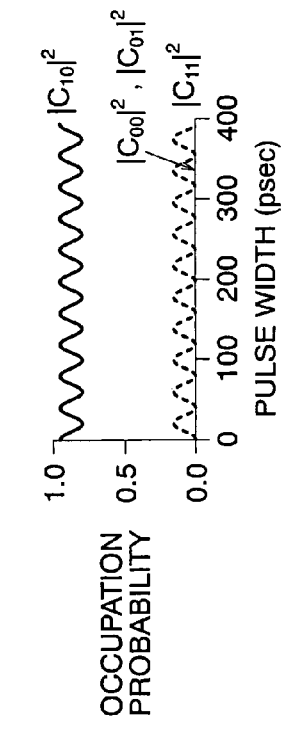

Another alternative approach allows a pulse to have finite rise and fall times as shown in FIG. 6E. Advantageously, the finite rise and fall times reduce the oscillation amplitude of each of $c_{10}$ and $c_{11}$ in FIG. 6C. FIG. 6F corresponds to FIG. 6C on the assumption that a trapezoidal pulse has rise and fall times each corresponding to 30 ps is used.

The oscillation amplitude of $c_{10}$ approximately equals 0. It can be seen that an output corresponding to the input "10" is "10" with a probability of about 1 independent of a pulse width. Therefore, a pulse having the shortest width shown by the arrows in FIG. 6F can always be used for controlled NOT. This approach has an advantage in terms of finite coherence time. As is obviously understood from FIG. 6D, unfortunately, the finite rise and fall times reduce the oscillation amplitude of $c_{10}$. The extent of rise and fall times to be added or adding no rise and fall times must be determined in accordance with the conditions of the actual system.

The controlled-NOT gate can use a microwave pulse in addition to the above-mentioned voltage pulse.

Referring to FIG. 5B, the operating point is set to $n_{g2}=0.2$.

The microwave pulse is resonant with the energy gap between the points A and E in FIG. 5B. The microwave pulse is applied to the system. Assuming that an input is "00", namely, in the point A, Rabi oscillation occurs due to the application of the microwave pulse. The oscillation occurs between the states "00" and "01". The period of oscillation depends on the power of microwave pulse. The application time of microwave pulse is controlled in a manner similar to the above-mentioned voltage pulse, thus obtaining the state "01" as an output.

On the other hand, even if the same microwave pulse is applied to an input "10", namely, to the state in the point C, the microwave pulse is not resonant with any energy gap. The state is not changed. The same applies to inputs "01" and "11". Consequently, the controlled-NOT quantum gate can be implemented by the microwave pulse.

As mentioned above, according to the present invention, a controlled-NOT gate in superconducting charge quantum bits coupled by a capacitor can be provided.

What is claimed is:

1. A superconducting charge quantum multi-bit device, comprising:
   a first superconducting charge quantum bit device serving as a target quantum bit circuit;
   a second superconducting charge quantum bit device serving as a control quantum bit circuit; and
   an electric capacitor coupling the first and second superconducting charge quantum bit devices.

2. The device according to claim 1, wherein
   each of the first and second superconducting charge quantum bit devices includes a quantum box electrode comprising a superconductor, a counter electrode coupled to the quantum box electrode through a tunnel barrier, and a gate electrode coupled to the quantum box electrode through a gate electrostatic capacitor, and
   the quantum box electrode of the first superconducting charge quantum bit device is coupled to the quantum box electrode of the second superconducting charge quantum bit device through the electric capacitor.

3. A controlled-NOT gate using coupled superconducting charge quantum bits including first and second superconducting bit devices, wherein
   each of the first and second superconducting bit devices includes a quantum box electrode comprising a superconductor, a counter electrode coupled to the quantum box electrode through a tunnel barrier, and a gate electrode coupled to the quantum box electrode through a first electrostatic capacitor,
   the quantum box electrode of the first superconducting bit device is coupled to the quantum box electrode of the second superconducting bit device through a second electrostatic capacitor, and
   the gate electrode of the second superconducting bit device further includes pulse supply means for supplying a predetermined pulse.

4. The controlled-NOT gate according to claim 3, wherein the predetermined pulse includes a voltage, of which a peak value is determined by the first electrostatic capacitor of the second superconducting bit device, and a duration of the peak value is determined by a Josephson coupling energy produced between the corresponding superconducting box electrode and the counter electrode.

5. The controlled-NOT gate according to claim 3, wherein the predetermined pulse includes a trapezoidal pulse.

6. The controlled-NOT gate according to claim 3, wherein the pulse supply means supplies a microwave pulse as the predetermined pulse to the gate electrode of the second superconducting bit device.

7. The device of claim 1, as applied to provide a controlled-NOT gate function.

8. The device of claim 2, wherein a voltage determined by the gate electrostatic capacitor is applied to a corresponding gate electrode of each of the first and second superconducting bit devices for a predetermined time.

9. The device of claim 8, wherein the voltage determined by the gate electrostatic capacitor is obtained by dividing an elementary charge by the capacitance of the gate electrostatic capacitor.

10. The device of claim 2, wherein a respective DC bias is applied to the gate electrodes of the first and second superconducting charge quantum bit devices.

11. The device of claim 10, wherein a pulse signal is applied to at least one of the gate electrodes to thereby generate an entanglement.

12. The device of claim 11, wherein said pulse signal comprises a voltage pulse.

13. The device of claim 11, wherein said pulse signal comprises a microwave pulse.

14. A controlled-NOT gate, comprising:
   a first superconducting charge quantum bit device;
   a second superconducting charge quantum bit device; and
   an electric capacitor coupling the first and second superconducting charge quantum bit devices.

15. The controlled-NOT gate of claim 14, wherein:
   each of the first and second superconducting charge quantum bit devices includes a quantum box electrode comprising a superconductor, a counter electrode coupled to the quantum box electrode through a tunnel barrier, and a gate electrode coupled to the quantum box electrode through a gate electrostatic capacitor; and
   the quantum box electrode of the first superconducting charge quantum bit device is coupled to the quantum box electrode of the second superconducting charge quantum bit device through the electric capacitor.

16. The controlled-NOT gate of claim 15, wherein the gate electrode of the second superconducting bit device further includes a pulse supply means for supplying a predetermined pulse.

17. The controlled-NOT gate according to claim 16, wherein the predetermined pulse includes a voltage, of which a peak value is determined by the first electrostatic capacitor of the second superconducting bit device, and a duration of the peak value is determined by a Josephson coupling energy produced between a corresponding superconducting box electrode and the counter electrode.

18. The controlled-NOT gate of claim 15, wherein a respective DC bias is applied to the gate electrodes of the first and second superconducting charge quantum bit devices.

19. The controlled-NOT gate of claim 18, wherein a pulse signal is applied to at least one of the gate electrodes to thereby generate an entanglement.

20. The controlled-NOT gate of claim 19, wherein said pulse signal comprises a microwave pulse.

* * * * *